United States Patent [19]
Nozaki

[11] Patent Number: 5,202,849
[45] Date of Patent: Apr. 13, 1993

[54] DYNAMIC SEMICONDUCTOR MEMORY DEVICE

[75] Inventor: Shigeki Nozaki, Miyazaki, Japan

[73] Assignee: Fujitsu Limited, Kanagawa, Japan

[21] Appl. No.: 929,488

[22] Filed: Aug. 18, 1992

Related U.S. Application Data

[63] Continuation of Ser. No. 599,937, Oct. 19, 1990, abandoned.

[30] Foreign Application Priority Data

Oct. 20, 1989 [JP] Japan .................................. 1-273970

[51] Int. Cl.$^5$ ............................................. G11C 11/24
[52] U.S. Cl. ........................................ 365/149; 365/51
[58] Field of Search ............ 365/149, 150, 182, 189.01, 365/51

[56] References Cited

U.S. PATENT DOCUMENTS

Re. 33,261 7/1990 Baglee et al. ...................... 365/149

FOREIGN PATENT DOCUMENTS 0337436 10/1989 European Pat. Off. .

OTHER PUBLICATIONS

Patent Abstracts of Japan, vol. 13, No. 416 (E-821) [3764], Sep. 14, 1989; & Drawings of JP-A 1-155656. "An Optically Delineated 4.2-$\mu m^2$ Self-Aligned Isolated-Plate Stacked-Capacitor DRAM Cell", Kimura et al., IEEE Transactions on Electron Devices, vol. 35, No. 10, Part I, Oct., 1988, pp. 1591-1595.

*Primary Examiner*—Terrell W. Fears
*Attorney, Agent, or Firm*—Nikaido, Marmelstein, Murray & Oram

[57] ABSTRACT

A dynamic random access memory comprises a substrate, a transfer transistor provided on the substrate, a memory cell capacitor provided on the substrate in contact with a first diffusion region formed in the substrate, a first conductor pattern provided on the substrate to extend in a first direction as a word line, a first insulator layer provided on the substrate to bury the memory cell capacitor and the first conductor pattern, a first contact hole provided on the first insulator layer to expose a second diffusion region formed in the substrate, a second conductor pattern provided on the first insulator layer to extend in a second direction, passing above the memory cell capacitor and making a contact with the second diffusion region at the first contact hole, a second insulator layer provided on the second conductor pattern, a second contact hole provided on the second insulator layer at a part thereof that locates above the memory cell capacitor to expose the upper major surface of the second conductor pattern, and a third conductor pattern provided on the second insulator layer to extend in the second direction substantially coincident with the first conductor pattern as a bit line of the dynamic random access memory, wherein the third conductor pattern makes a contact with the second conductor pattern at the second contact hole.

6 Claims, 17 Drawing Sheets

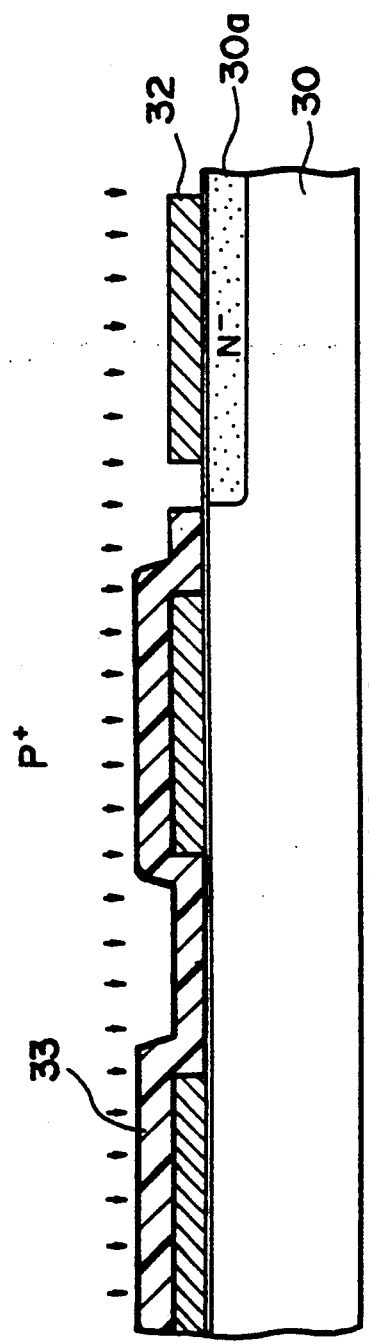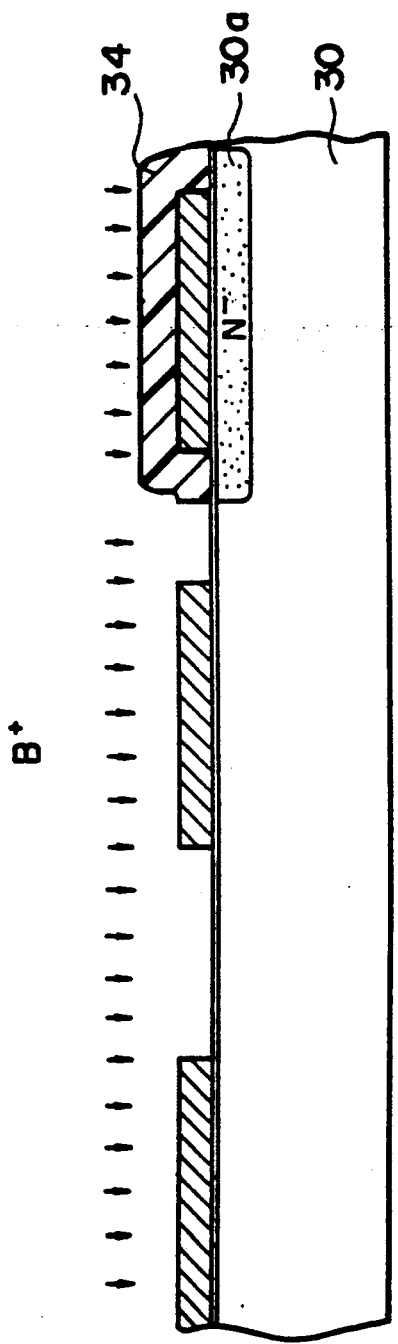
FIG.7C
FIG.7D

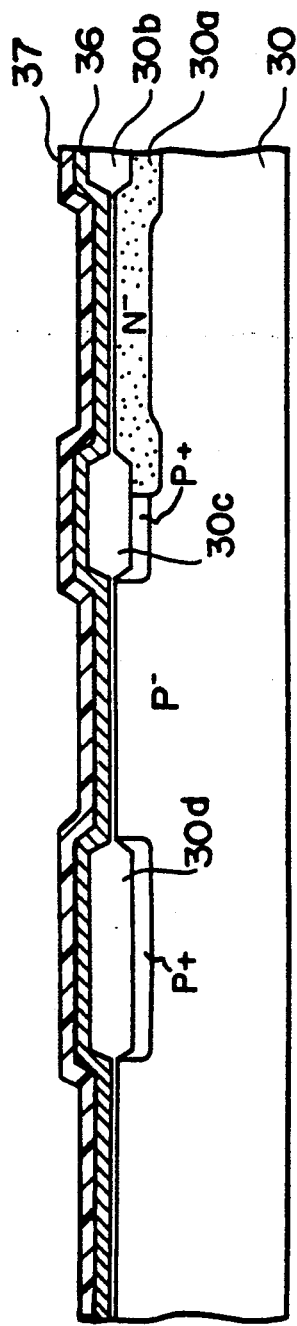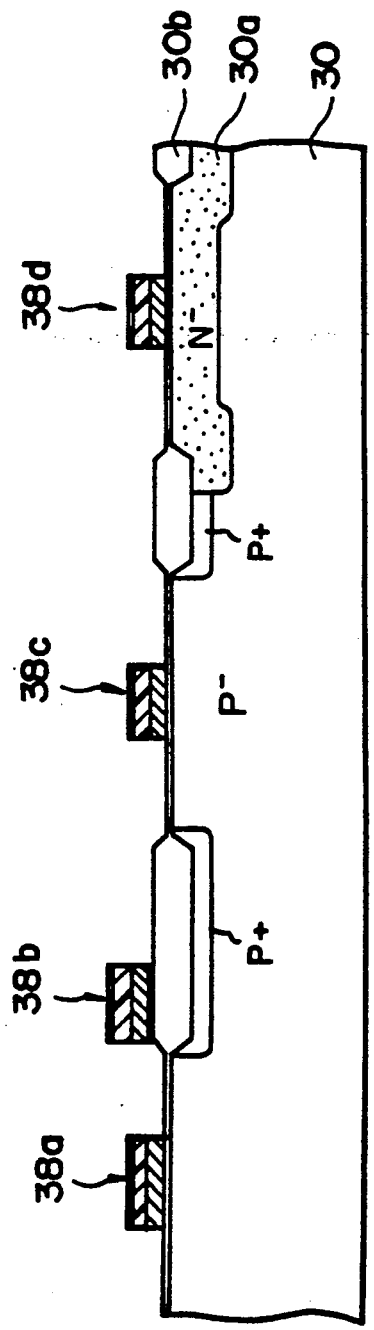

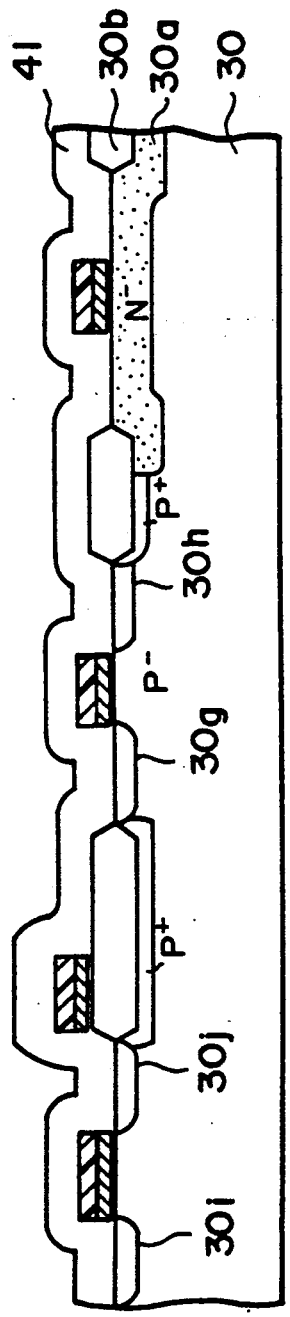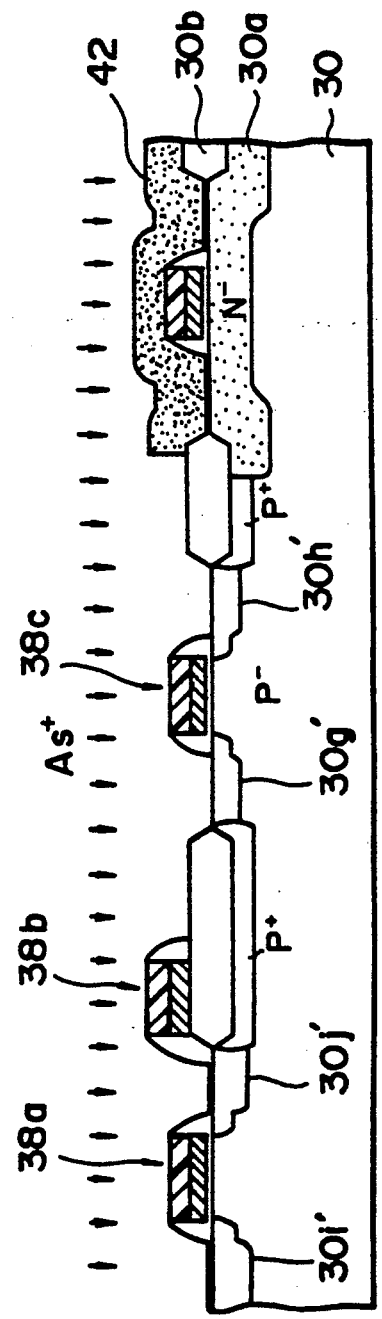

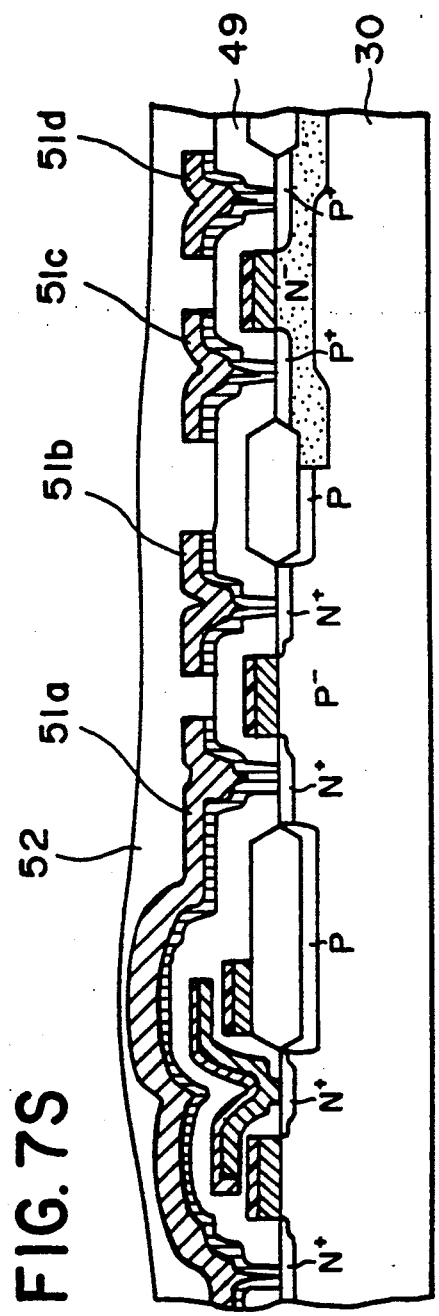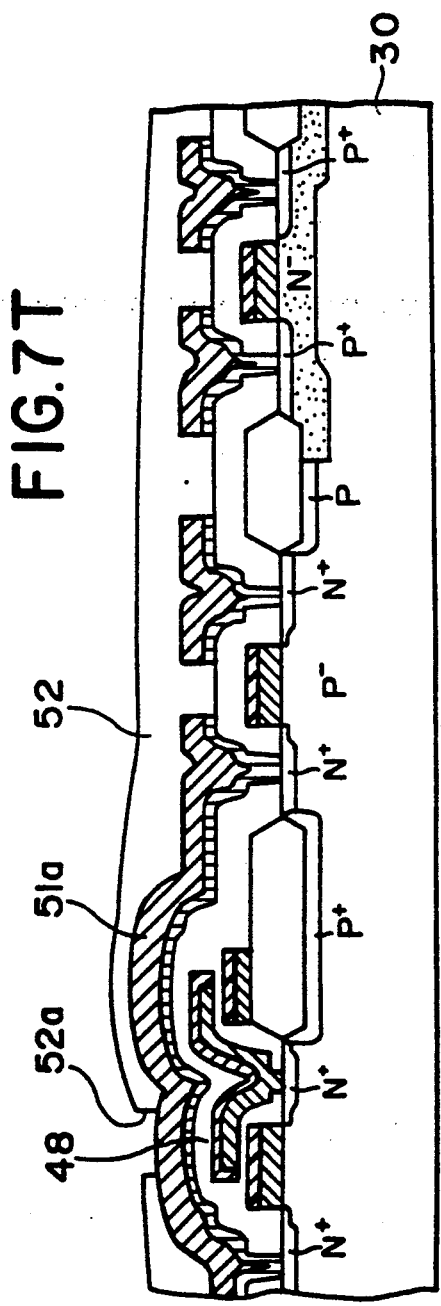

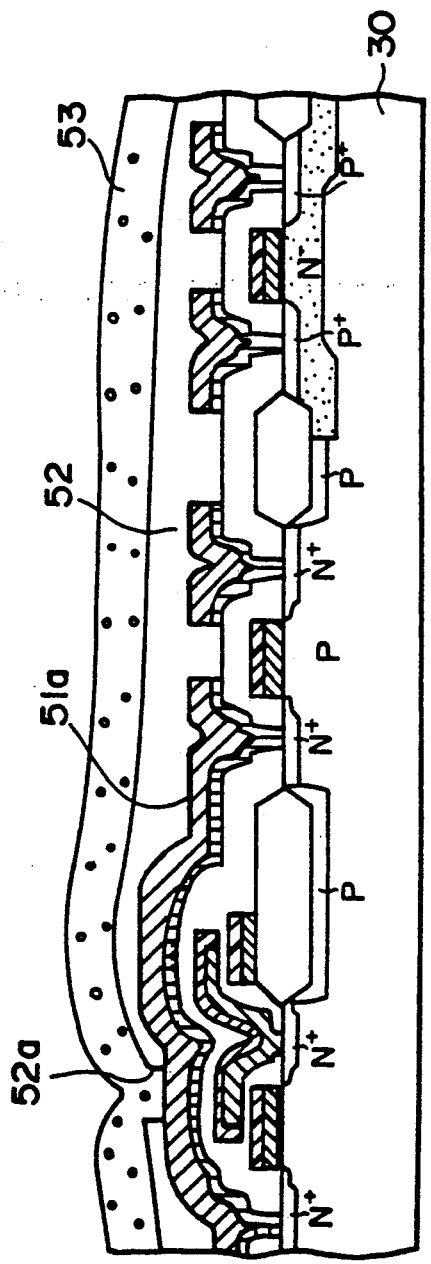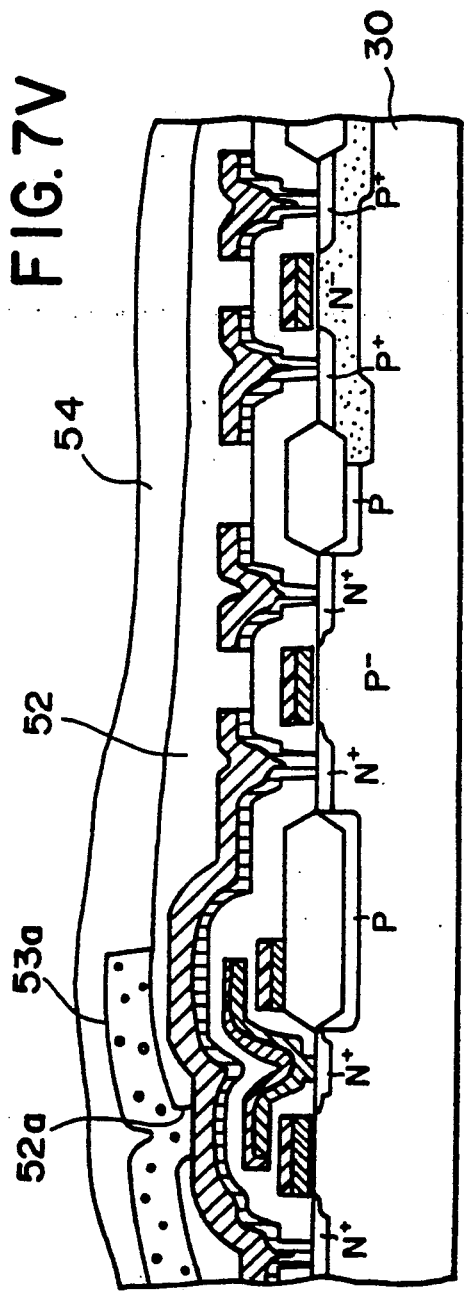
FIG. 7U
FIG. 7V

DYNAMIC SEMICONDUCTOR MEMORY DEVICE

This application is a continuation of application Ser. No. 599,937 filed Oct. 19, 1990, now abandoned.

BACKGROUND OF THE INVENTION

The present invention generally relates to semiconductor memory devices and more particularly to a dynamic random access memory.

A typical dynamic random access memory (DRAM) has a memory cell that includes a transfer transistor and a memory capacitor. Information is stored in the memory capacitor as electric charges. With the persistent demand of increased memory capacity and integration density, the area allowed for the transistor and the capacitor decreases ever and ever.

FIG. 1 shows an overall construction of a typical conventional DRAM.

Referring to FIG. 1, there is provided a substrate 1 on which a strip-like region 2 for word line decoder is formed in a first direction. Further, a plurality of strip-like regions 3 for sense amplifiers and column decoders are formed on the substrate at both sides of the region 2 in a second direction substantially perpendicular to the first direction. On the substrate 1, there are provided a number of cell blocks 4 along the region 3. There are formed a number of cell blocks 4 on the substrate 1 arranged in a row and column formation. From the word line decoder in the region 2, a number of word lines WL extend in the second direction parallel with each other. Similarly, a number of bit lines BL extend from each region 3 in the first direction parallel with each other.

FIG. 2 shows a part of the DRAM of FIG. 1 in an enlarged scale.

Referring to FIG. 2, the word line WL of FIG. 1 corresponds to a conductor 11 that extends vertical in FIG. 1, while the bit line BL corresponds to a conductor 12 extending laterally in the drawing. Further, there are provided a number of memory cells C each connected with a word line conductor 11 and a bit line conductor 12 at a contact hole 11a and a contact hole 12a.

FIG. 11 shows a cross-sectional view of the memory cell C taken along a line 1—1' of FIG. 2.

Referring to FIG. 3A, the memory cell C is formed in a region of the substrate 1 defined by a field oxide region 1a, wherein the substrate 1 is formed with a source region 1b and a drain region 1c with a gate electrode 11 provided on the substrate 1 in correspondence to a channel region located in the substrate 1 between the source region 1b and the drain region 1c. The source region 1b, the drain region 1c and the gate 11 form a transfer transistor T that forms the memory cell C. As usual, the gate electrode 11 is separated from the substrate 1 by a thin gate oxide film.

It should be noted that the gate electrode 11 coincides with the word line 11 of FIG. 2 and may be formed of polysilicon. On the other hand, the drain region 1c is contacted with a polysilicon electrode 14a that extends upwards on the substrate 1 and spreads laterally along an insulator layer 13 that is deposited on the substrate 1 to bury the gate electrode 11 and the field oxide region 1a. Thereby, the polysilicon electrode 14a forms an electrode of a memory cell capacitor CAP.

On the electrode 13, a thin film 15 of dielectric material such as silicon nitride is provided and another polysilicon layer 14b is provided to cover the silicon nitride film 15 at a side opposite to the side that is contacted with the polysilicon electrode 14a. Thereby, the electrode 14b forms an electrode of the memory capacitor CAP opposing the electrode 14a. It should be noted that this electrode 14b may extend throughout the memory cell block 4 shown in FIG. 1 as a conductive sheet except for a cutout formed in correspondence to the contact hole 12a where the bit line 12 makes a contact with the memory cell transistor T. Further, the capacitor CAP is buried under an insulator layer 16.

Referring to FIG. 3A again, the source region 1b of the transistor T is contacted with a polysilicon layer that acts as the bit line 12 at the contact hole 12a. This polysilicon layer 12 extends along the insulator layer 16 that covers the capacitor C in the direction of the bit line and forms a conductor strip of polysilicon extending in the lateral direction in the plan view of FIG. 2.

The bit line conductor 12 is buried under an insulator layer 17 on which a number of conductor strips 11b are provided parallel with each other in correspondence to the gate electrode or the word line 11. The conductor strip 11b may be made of aluminum and is contacted with the polysilicon word line 11 at the contact hole 11a.

FIG. 3B shows the connection of the polysilicon word line 11 and the aluminum strip 11b at the contact hole 11a, wherein FIG. 3B is a cross-sectional view taken along a line 2—2' of FIG. 2. It should be noted that the contact hole 11a is formed on the field oxide region 1a with an offset from the memory cell C along the conductor strip 11. By supplying the word line selection signal along the aluminum conductor strip 11b that has a characteristically low resistivity, the time constant of the signal path connected to the gate of the memory cell transfer transistor T is reduced and a quick addressing of the memory cell is achieved. It should be noted that the word lines tend to extend for a distance much longer than the bit lines as can be seen in FIG. 1.

FIG. 4 shows another example of the conventional DRAM device, wherein FIG. 4 shows a cross-sectional view corresponding to the cross-sectional view of FIG. 3A. In this example, there is provided a polysilicon electrode 12b directly in contact with the source region 1b of the transistor T and the electrode 12b is contacted with the bit line 12 of aluminum at the contact hole 12a. The aluminum bit line is provided on the insulator layer 16, similarly to the case of the device of FIG. 3A.

In this example, too, the polysilicon word line 11 is connected to the aluminum word line 11b at the contact hole 11a offset from the memory cell C and thereby a quick response of the memory cell is achieved. In the present case, the response is improved further as a result of use of the aluminum conductor for the bit line in stead of using polysilicon bit lines. As the bit lines is connected to write amplifiers and the sense amplifiers, the decrease of resistivity in the bit lines by the use of aluminum for the bit lines contributes significantly on the improvement in the response of the memory device.

In the DRAM devices of the latter type in particular, there arises a problem in that, when the contact hole 12a is provided with a slight offset to the capacitor Cap due to the error in patterning and the like, the polysilicon electrode 12b may be contacted with the polysilicon electrode 14b. This risk obviously increases with decreasing size of the DRAM device. Further, the decreasing in the size of the DRAM invites inevitable decrease in the diameter of the contact hole 12a. When the diameter of the contact hole becomes excessively small, the deposition of aluminum in contact with the polysilicon electrode 12b at the contact hole 12a becomes difficult because of the poor step coverage of aluminum deposited by sputtering.

The problem of poor contact between the polysilicon electrode 12b and the aluminum bit line 12 is deteriorated further when the structure is applied to the DRAM device having a so-called stacked capacitor wherein the memory capacitor Cap is formed into a number of layers of dielectric films. When such a structure is adopted, the depth of the contact hole 12a becomes inevitably large and thereby the step coverage is degraded further. This means that the yield and reliability of the DRAM is decreased with increasing degree of miniaturizations.

SUMMARY OF THE INVENTION

Accordingly, it is a general object of the present invention to provide a novel and useful dynamic random access memory device wherein the problems mentioned previously are eliminated.

Another and more specific object of the present invention is to provide a dynamic random access memory device that uses aluminum for the word lines and bit lines, wherein a reliable contact is achieved between a transfer transistor in the dynamic random access memory device and the aluminum bit line.

Another object of the present invention is to provide a dynamic random access memory device comprising a memory transistor, a memory capacitor and an aluminum bit line, wherein the aluminum bit line is connected to an electrode of the memory transistor at a contact hole provided in correspondence to the memory capacitor in an insulator layer that covers the memory capacitor underneath. According to the present invention, a large area corresponding to the area of the memory capacitor can be secured for the contact hole and a reliable contact is guaranteed even when the memory device is miniaturized or even when the memory device employs the stacked capacitor structure wherein a number of dielectric films are stacked. Further, as the stacked capacitor structure provides a mechanically solid base for the insulator layer that carries the contact hole, the contact between the electrode and the aluminum bit line remains stable during a number of thermal processes employed at the time of fabrication of the semiconductor device. It should be noted that the stacked capacitor structure is buried in a thick insulator layer that locates below the insulator layer in which the contact hole is formed. Such a thick insulator layer tends to cause ductility upon heating and when the contact hole is provided in a location other than the region immediately above the stacked capacitor structure, there is a substantial risk that the contact hole is deformed or even moved and the connection at the contact hole may cause a failure. Further, such a thick insulator layer, having a tendency of absorbing water, may release the absorbed water upon heating and thereby the insulator layer may be cracked or detached from adjacent layers. The present invention avoids various of such problems by setting the contact hole at the region immediately above the stacked capacitor structure wherein the thickness of the second insulator layer that buries the stacked capacitor structure is thin.

Other objects and further features of the present invention will become apparent from the following detailed description when read in conjunction with the attached drawings.

DETAILED DESCRIPTION

Figure 5:
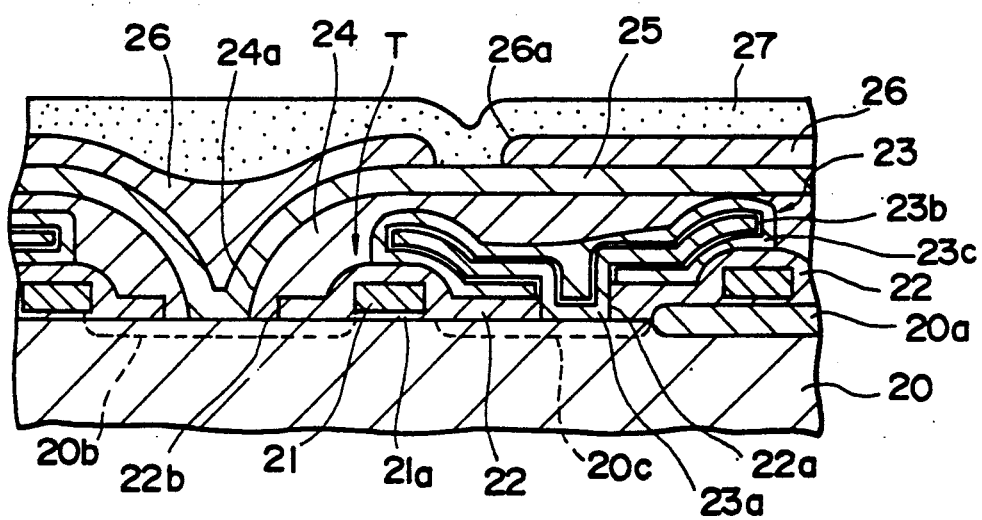
FIG. 5 is a cross-sectional view showing a first embodiment of the dynamic random access memory of to the present invention.

FIG. 5 shows a first embodiment of the DRAM of the present invention.

Referring to FIG. 5, the DRAM is constructed on a silicon substrate 20 on which is formed a field oxide isolation region 20a. The substrate 20 is further formed with diffusion regions 20b and 20c respectively acting as the source and drain of the memory cell transistor T.

On the substrate 20, there is provided a gate oxide film 21a and a gate electrode 21 of polysilicon is provided on the gate oxide film 21a. Further, the gate electrode 21 is covered with an insulator layer 22 that may be a silicon oxide deposited by chemical vapor deposition. The insulator layer 22 is formed with a first contact hole 22a that exposes the diffusion region 20c formed in the substrate 20. It should be noted that the gate electrode 21 extends vertical to the plane of FIG. 5 and forms the word line WL shown in FIG. 1.

In contact with the diffusion region 20c at the contact hole 22a, there is provided a stacked memory capacitor structure 23 that comprises a polysilicon storage electrode layer 23a, a silicon nitride dielectric film 23b and an opposing polysilicon electrode layer 23c. It should be noted that the electrode layer 23a and the electrode layer 23c sandwiches the dielectric film to form a capacitor. It should be noted that the memory capacitor 23 thus formed spreads laterally above the insulator layer 22 to achieve a capacitance as large as possible. Further, there is provided a second contact hole 22b in the insulator layer 22 such that the contact hole 22b exposes the first diffusion region 20b in the substrate 20.

On the insulator layer 22, there is provided a second insulator layer 24 such that the layer 24 buries the memory capacitor 23 underneath. Further, the insulator layer 24 is patterned to have a contact hole 24a substantially in coincident with the contact hole 22b. Thereby, the diffusion region 20b is exposed at the contact hole 24a. This insulator layer 24 may be a silicon oxide deposited by the chemical vapor deposition process.

Figure 1:
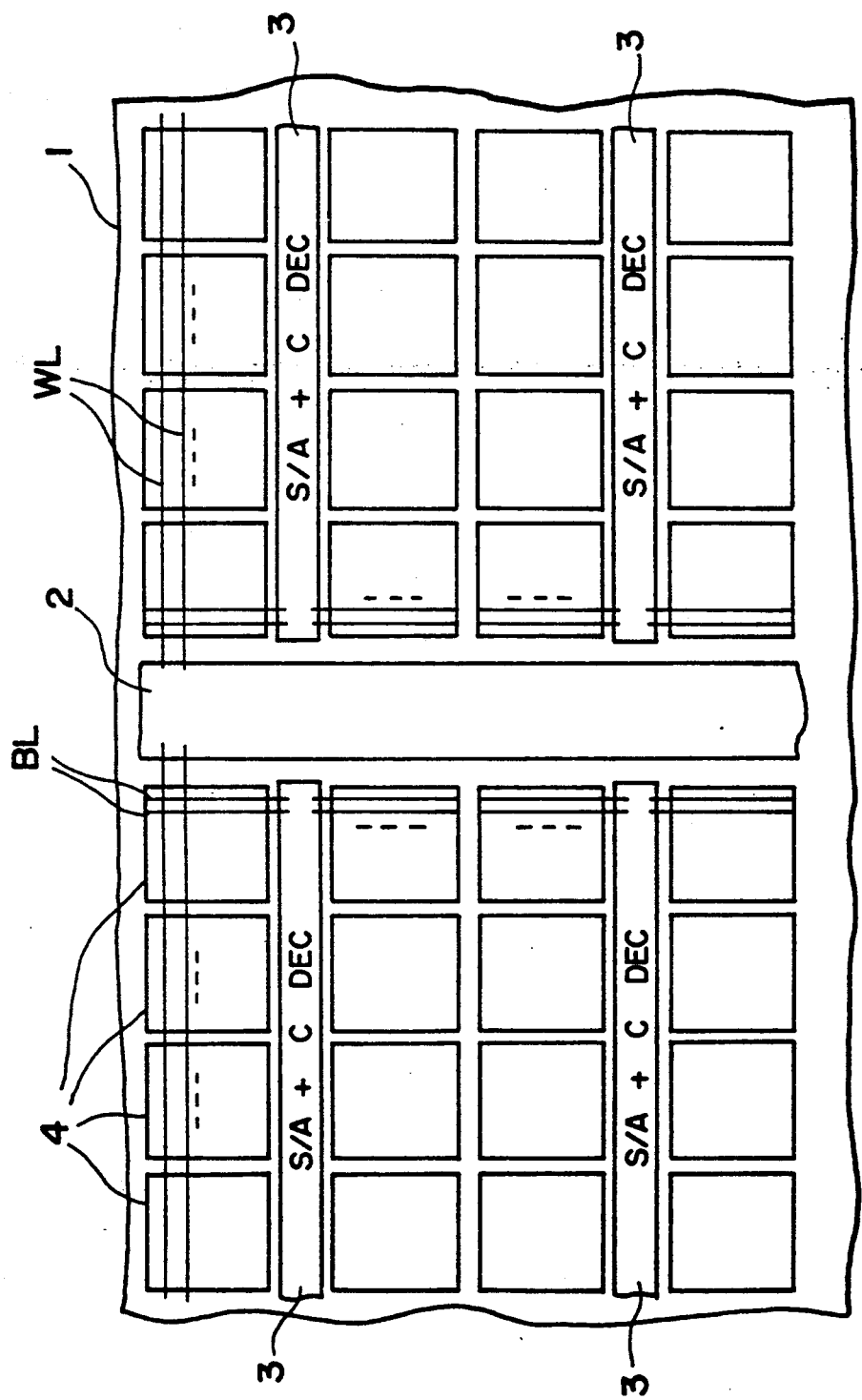
FIG. 1 is a schematic diagram showing the general construction of a conventional dynamic random access memory in a plan view.
Figure 2:
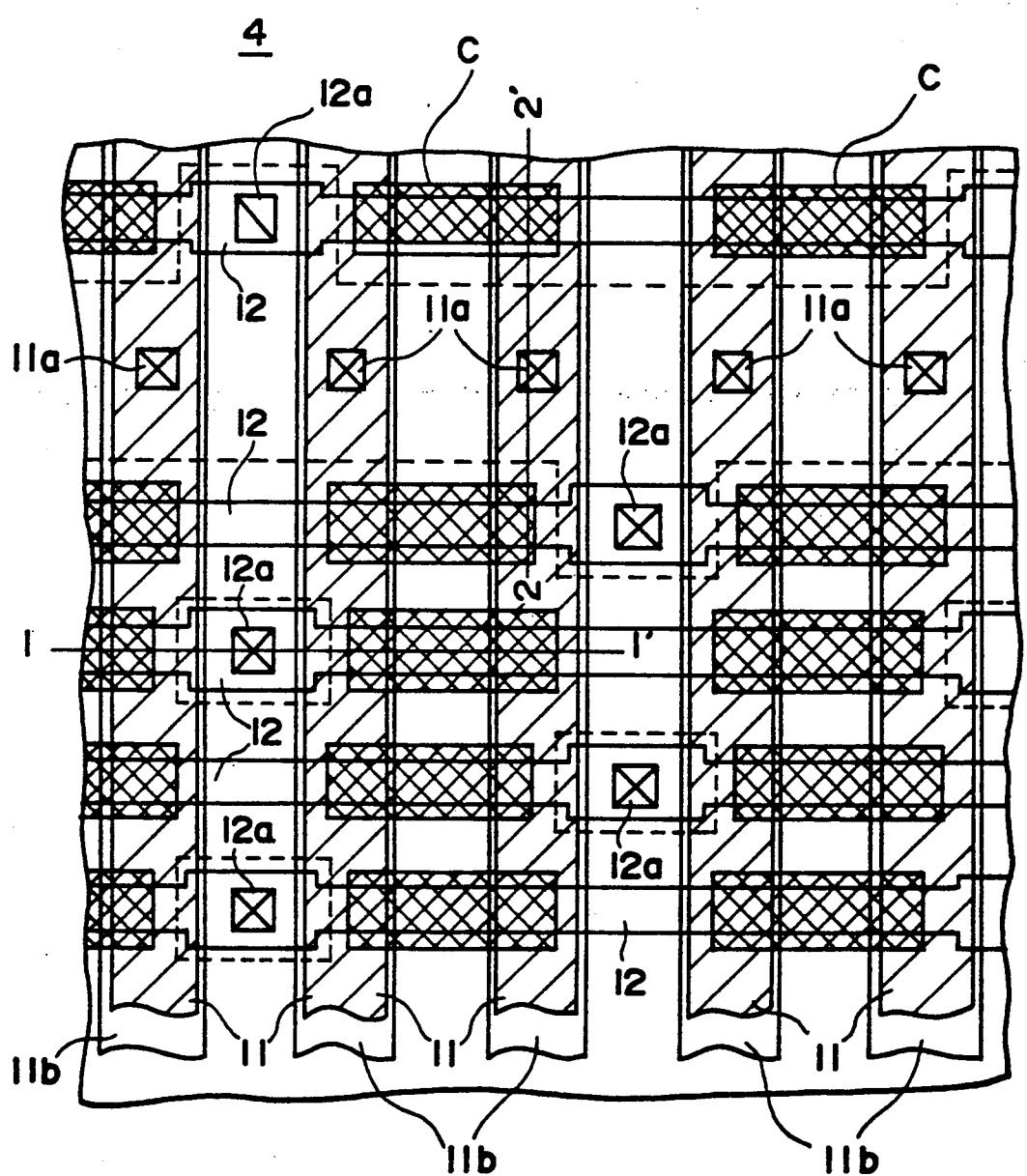
FIG. 2 is a plan view showing a part of the device of FIG. 1 in an enlarged scale.
Figure 3A:
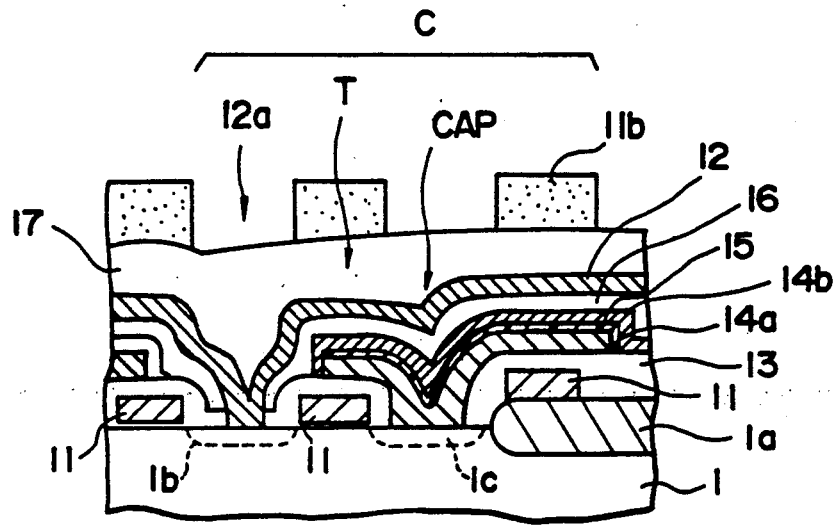
FIG. 3A is a cross-sectional view showing the memory cell in the device of FIG. 2 along a line 1—1'.
Figure 3B:
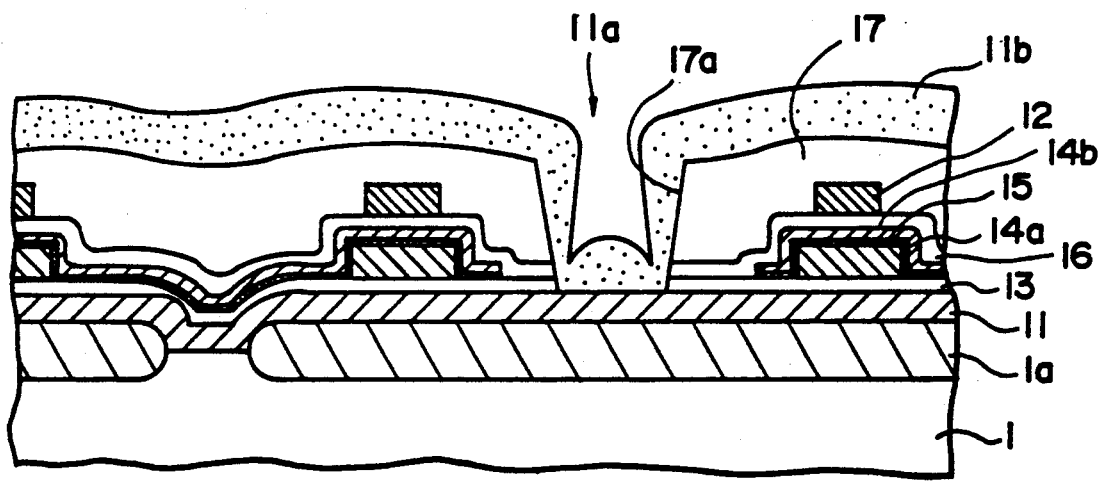
FIG. 3B is a cross-sectional view showing the memory cell in the device of FIG. 2 along a line 2—2'.
Figure 4:
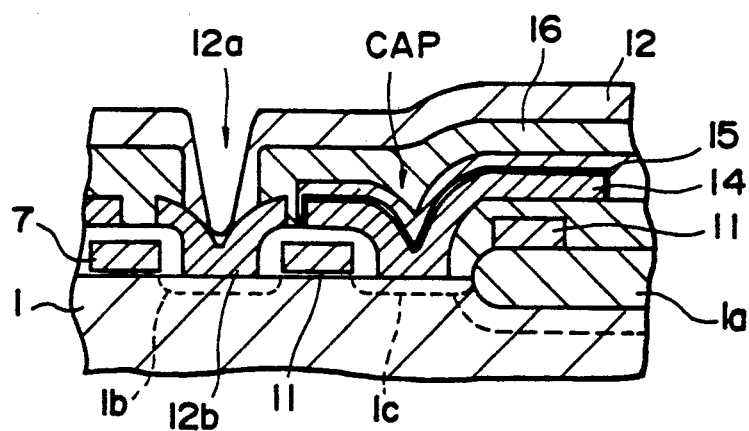
FIG. 4 is a cross-sectional view corresponding to FIG. 3A showing another conventional dynamic random access memory.

On the insulator layer 24, there is provided a polysilicon layer 25 that extends laterally in the drawing like a strip and forms a bit line corresponding to the bit line BL shown in FIG. 1.

The important feature of the present invention exists in the fact that the polysilicon bit line 25 is connected to an aluminum bit line characterized by a low resistivity such that reading and writing of data can be achieved at a high speed because of the reduced time constant in the bit line. In order to connect the aluminum bit line, there is provided another insulator layer 26 on the polysilicon bit line 25, and a contact hole 26a is formed in the insulator layer 26 in correspondence to where the memory capacitor 23 is formed. Further, an aluminum interconnection 27 is provided on the insulator layer 26 to make a contact with the polysilicon bit line 25 at the contact hole 26a. The insulator layer 26 may preferably be a material that shows ductility such as PSG (phosphosilicate glass), BPSG (boro-phosphosilicate glass), or SOG (spin-on-glass) such that the depression formed in the polysilicon layer 25 in correspondence to the contact hole 24a is filled and a planarized surface is obtained at the top of the insulator layer 26.

One important feature of the present invention lies in the fact that the contact hole 26a is formed in correspondence to the memory capacitor 23. By doing so, one can achieve at least following advantages.

Figure 6:
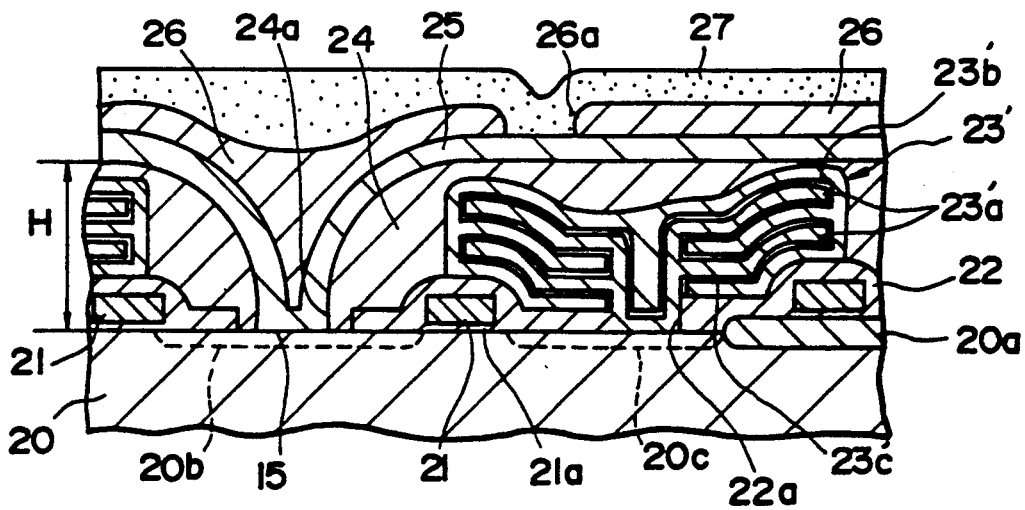
FIG. 6 is a cross-sectional view showing a second embodiment of the dynamic random access memory of the present invention.

(a) As the memory capacitor 23 is formed from the polysilicon layers 23a and 23c with the thin dielectric film 23b intervening therebetween, a mechanically rigid support is obtained for the electric contact provided at the contact hole 26a located immediately above the memory capacitor 23. It should be noted that the silicon oxide layer 24 under the polysilicon layer 25, or the insulator layer 26 on the polysilicon layer 25 in particular, has a tendency to absorb water and the water thus absorbed are released upon heat treatment that is employed at the later stage of DRAM fabrication. Thus, there is a substantial risk that the silicon oxide layer 24 or the insulator layer 26 is deformed or cracked. Such a mechanical instability of the contact hole 26a inevitably invites mechanical instability of the electric contact. This mechanical instability obviously increases with increasing layer thickness of the insulator layers as in the case where a stacked capacitor is used for the memory capacitor 23 as will be described with reference to FIG. 6 showing a second embodiment.

(b) The contact hole 26a may be provided on the entire area of the memory capacitor 23. Thereby a reliable contact can be achieved.

Next a second embodiment of the present invention will be described with reference to FIG. 6. In FIG. 6, the parts that are constructed identical with those corresponding parts in FIG. 5 are designated with same reference numerals and the description thereof will be omitted.

In this embodiment, there is provided a so-called stacked memory capacitor 23'0 wherein a silicon nitride dielectric film 23b, is folded into a number of layers, and a polysilicon storage electrode 23a' and a polysilicon opposing electrode 23c' are provided into a number of layers in correspondence to the dielectric film 23b'. Thereby, the electric charge that can be stored in the memory cell capacitor can be increased significantly.

In such a structure, the increase in the thickness H of the insulator layer 24 is inevitable. Thereby, the problem of mechanical unstability of the contact hole 26a described previously with reference to the first embodiment becomes a serious problem when the contact hole 26a is provided in a region other than the region immediately above the stacked memory cell capacitor 23'. It should be noted that the thickness of the insulator layer 24 is relatively thin in the region immediately above the stacked memory cell capacitor 23' even when the overall thickness H of the insulator layer 24 is large. Thus, it will be understood that the structure of the DRAM according to the present invention is particularly suited for the DRAM device that employs the stacked capacitor construction for the memory cell capacitor. The stacked capacitor and the fabrication process thereof are well known from literature such as the Laid-open European patent application EP 0 295 709 A2 which is incorporated herein as reference.

Figure 7A:
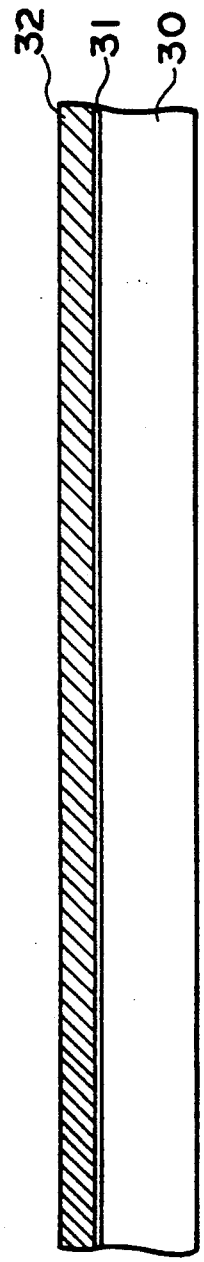
FIGS. 7A–7X are diagrams showing a fabrication process of the dynamic random access memory.
Figure 7B:
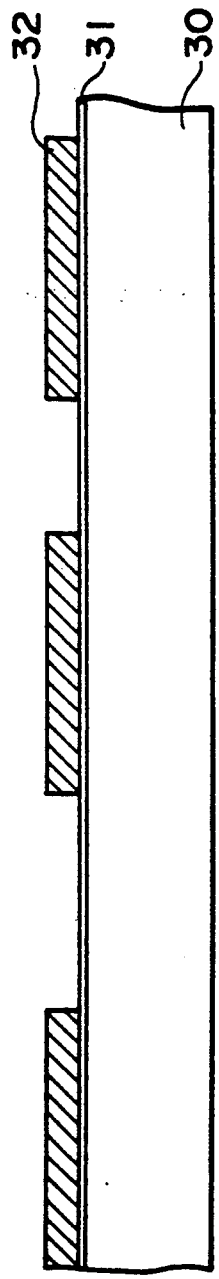
Figure 7E:
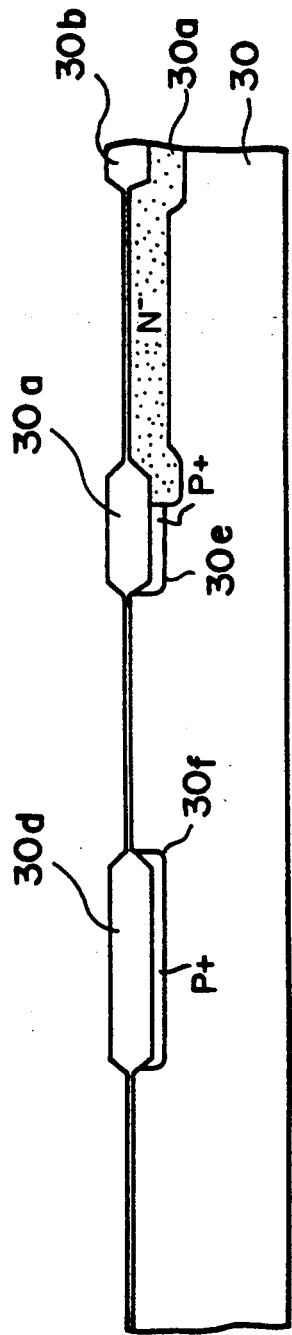
Figure 7F:
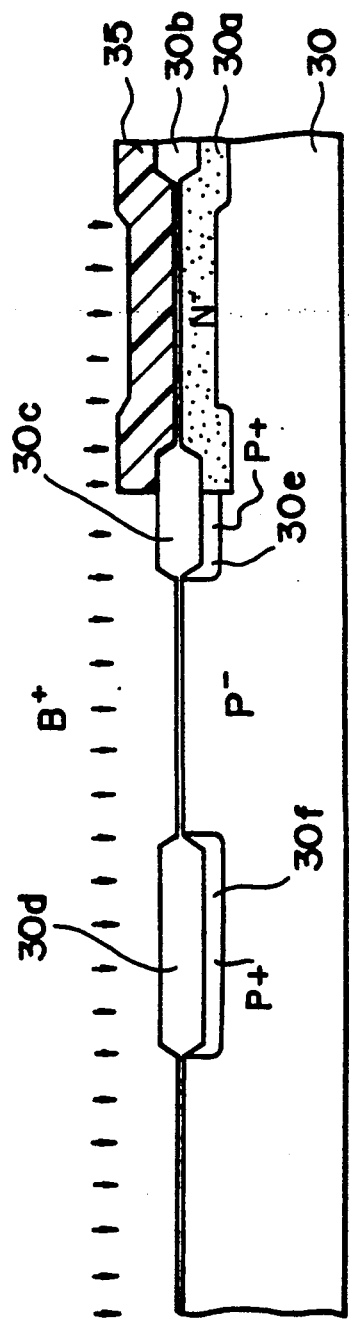
Figure 7I:
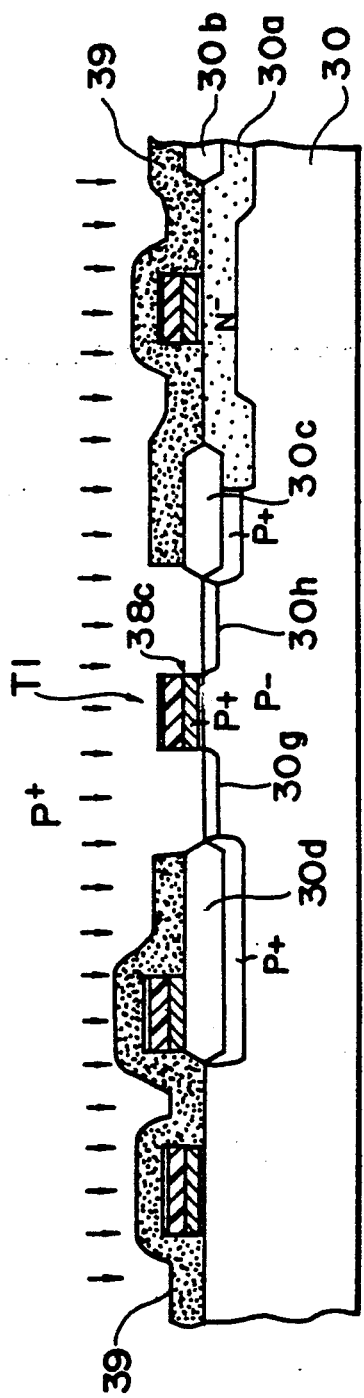
Figure 7J:
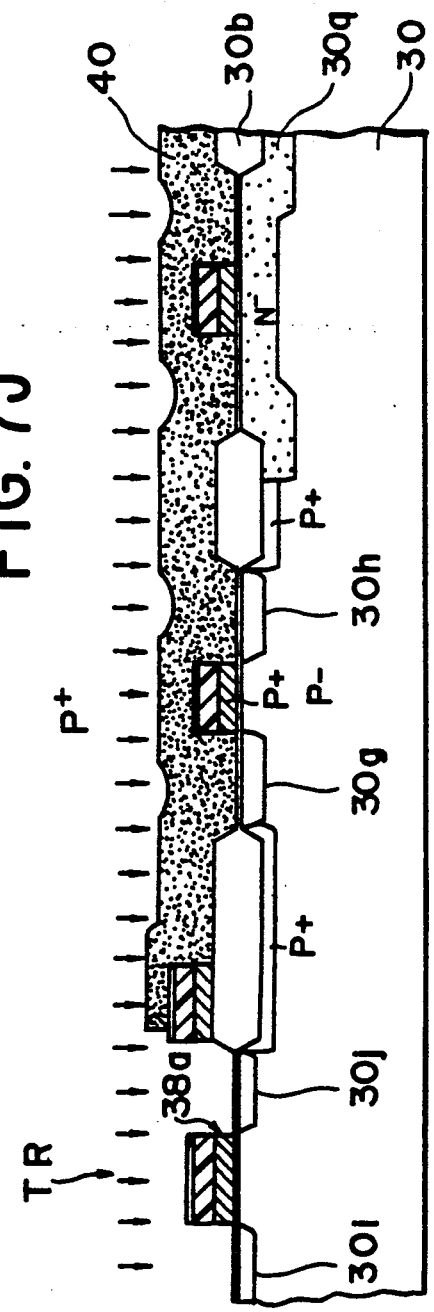
Figure 7M:
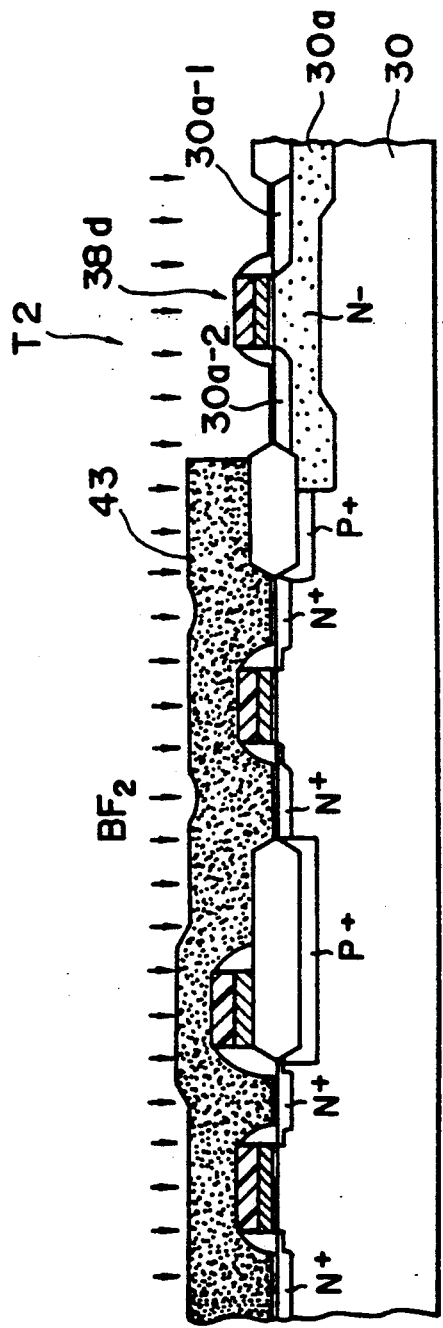
Figure 7N:
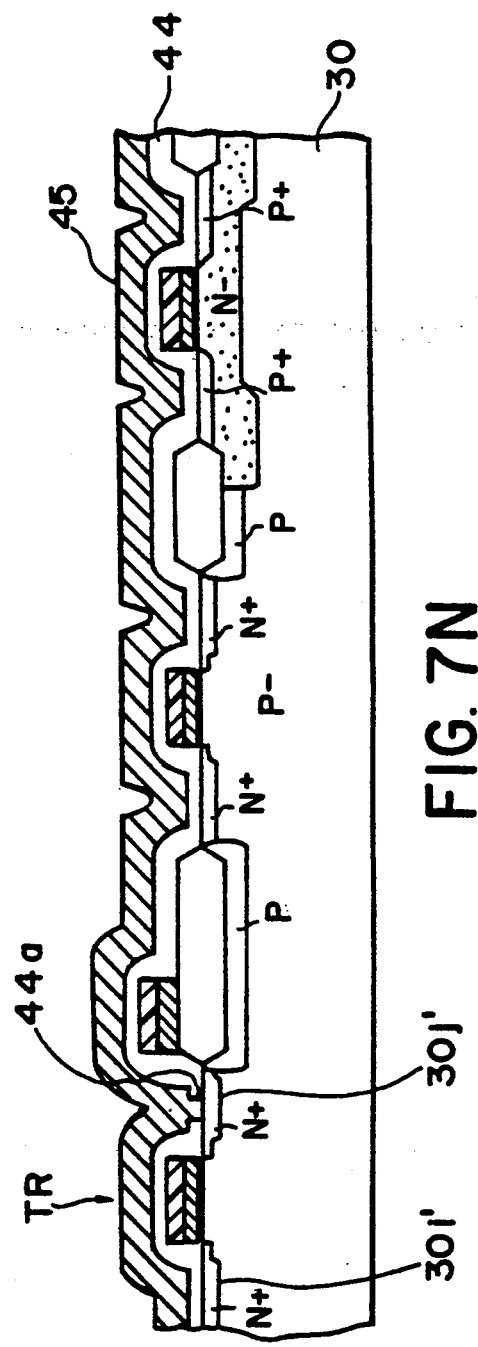
Figure 7O:
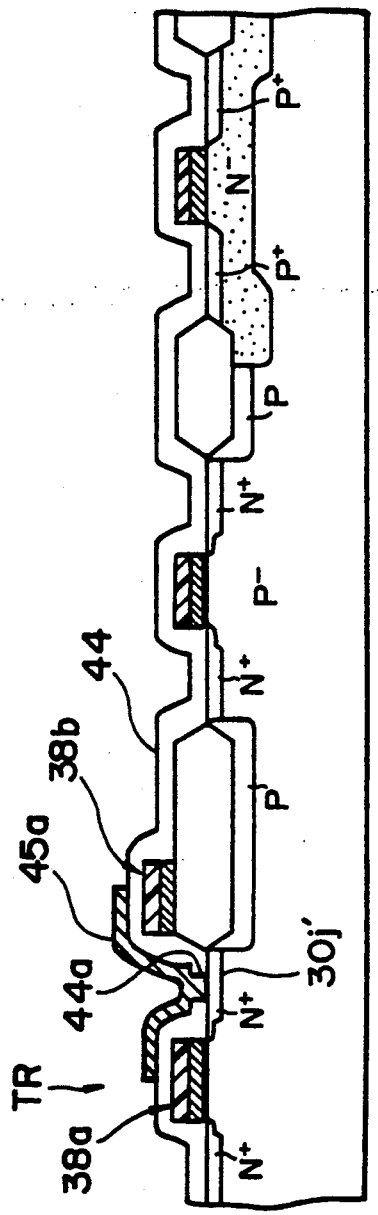
Figure 7P:
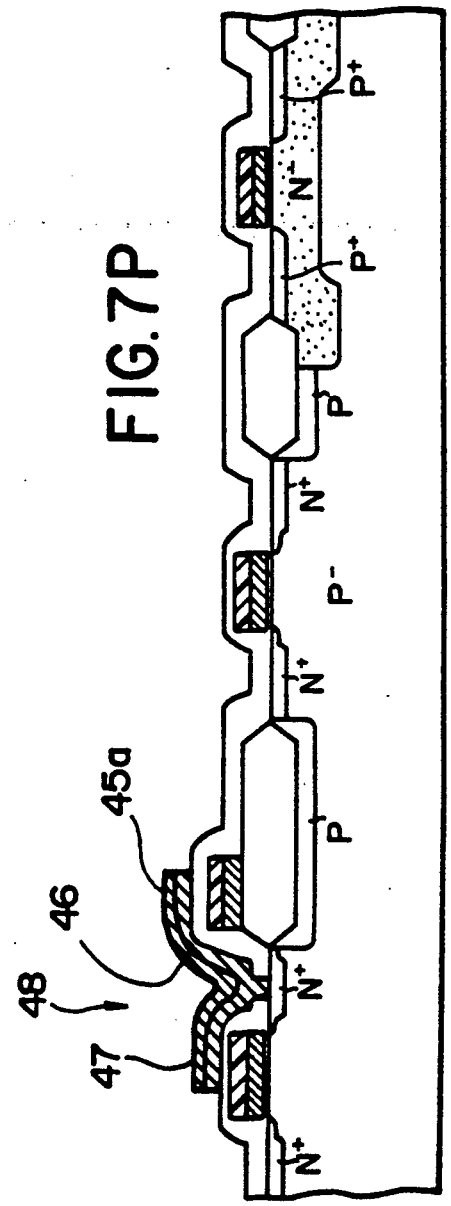
Figure 7Q:
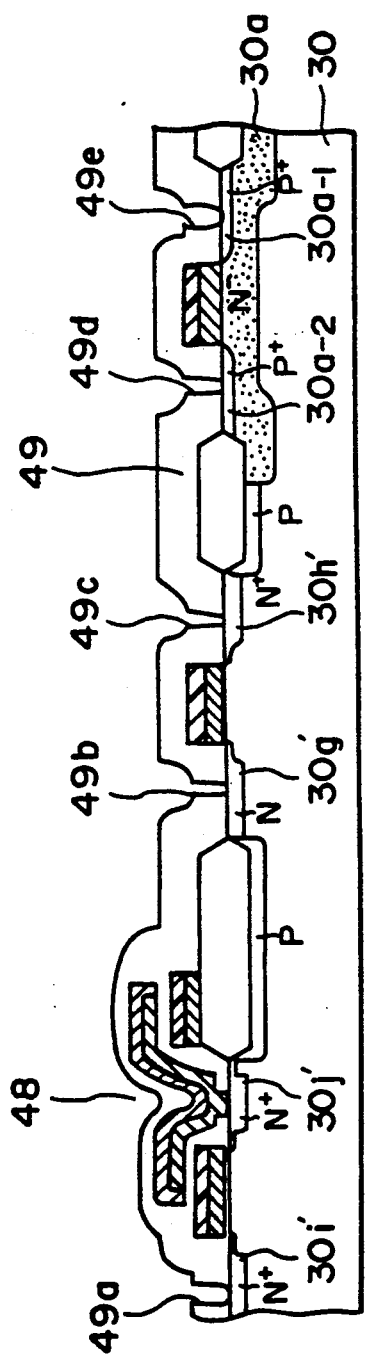
Figure 7R:
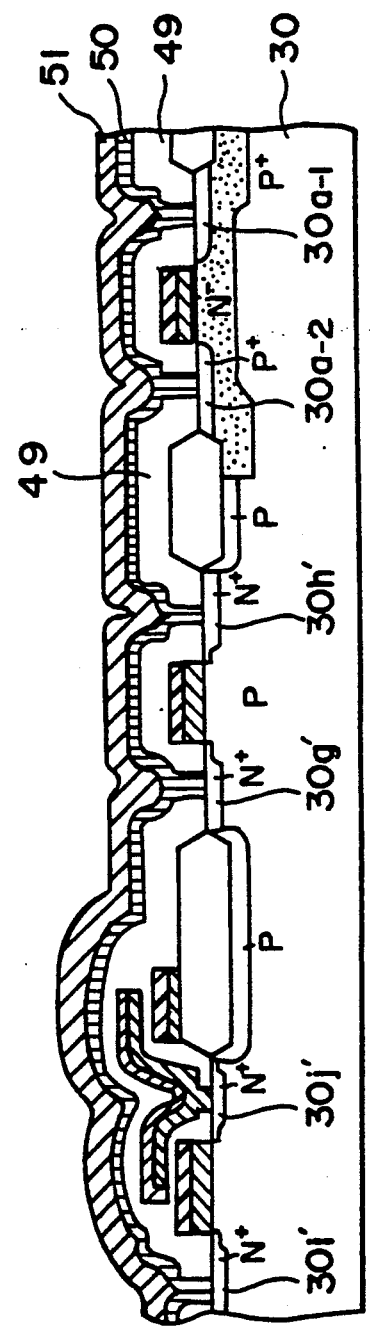
Figure 7W:
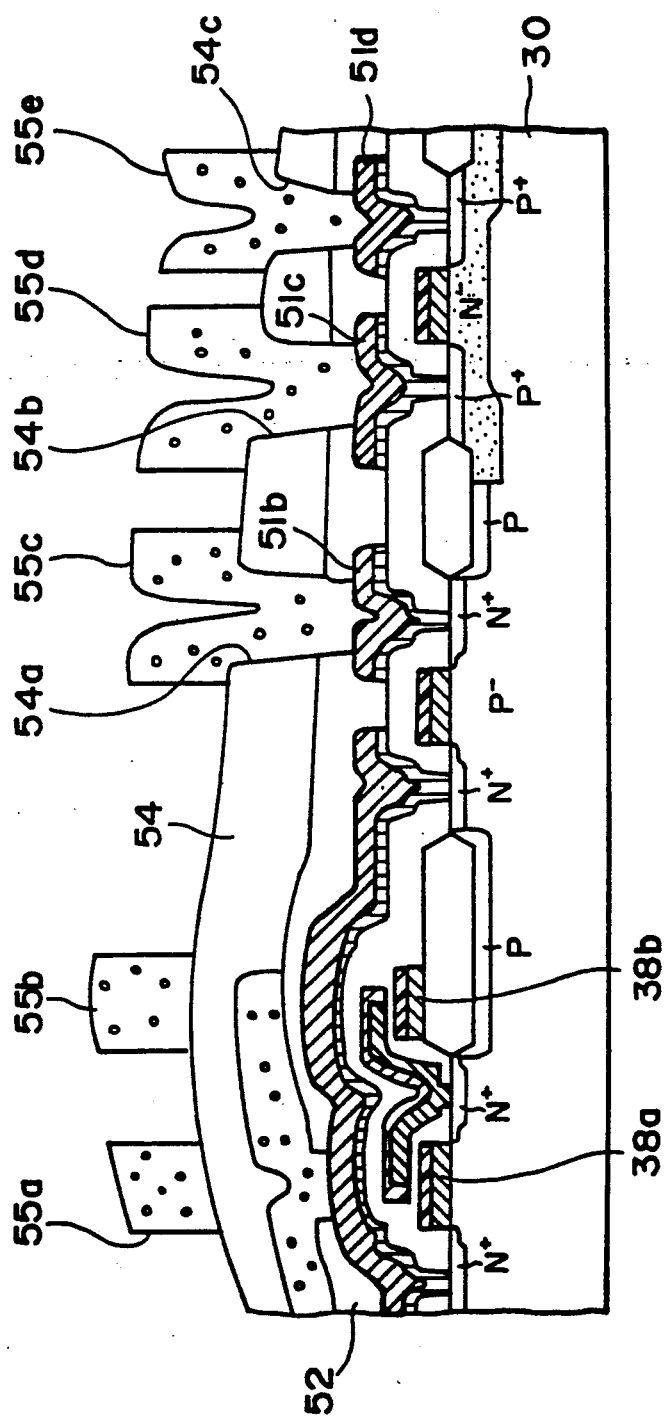
Figure 7X:
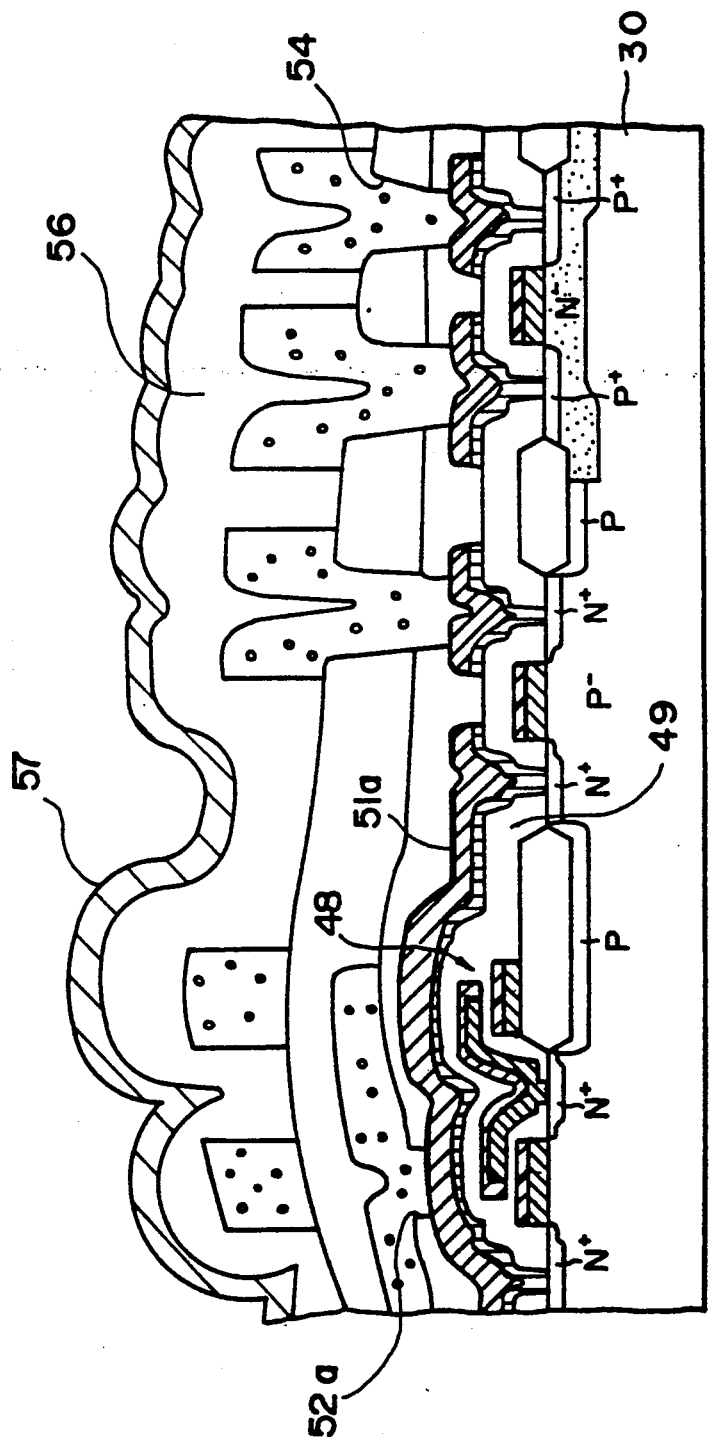

Next, a third embodiment of the present invention will be described with reference to FIGS. 7A–7X showing the fabrication steps of the DRAM.

Referring to FIG. 7A, a silicon substrate 30 is subjected to an oxidation step done in a dry atmosphere. Thereby a thin silicon oxide layer 31 is formed with a thickness of about 200 Å to cover the surface of the silicon substrate 30. Further, a silicon nitride layer 32 is deposited on the layer 31 with a thickness of about 1500 Å.

In a step of FIG. 7B, the silicon nitride layer 32 is patterned in correspondence to the field oxide region to be formed later, and in a step of FIG. 7C, an ion implantation of phosphorus ion is conducted using a photoresist 33 as a mask. Thereby, an $n^-$-type well 30a is formed in the substrate 30.

Next, in a step of FIG. 7D, the photoresist 33 is removed and another photoresist 34 is provided to protect the $n^+$-type well thus formed. Further, ion implantation of boron is conducted into the area of the substrate that is not protected by the photoresist 34. In a step of FIG. 7E, the photoresist 34 is removed and the structure thus obtained is subjected to a thermal oxidation process undertaken in a wet oxygen atmosphere at 900° C. Thereby, field oxide regions 30b–30d are formed with a thickness of about 5000 Å. A Under the field oxide region 30c, it should be noted that a $p^+$-type region 30e is formed for channel cutoff as a result of the ion implantation conducted in the step of FIG. 7D. Similarly another $p^+$-type channel cutoff region 30f is formed under the field oxide region 30d.

Further, in a step of FIG. 7F, an ion implantation of boron is conducted while protecting the $n^+$-type well 30a by a photoresist 35, and thereby the substrate 30 is doped to the $p^-$-type.

In a step of FIG. 7G, the photoresist 35 is removed and a polysilicon layer 36 is deposited on the entire surface of the structure thus obtained by the chemical vapor deposition with a thickness of about 1200 Å. This polysilicon layer 36 provides the word line of the DRAM device after patterning in a step of FIG. 7H. In a typical fabrication process, a tungsten silicide layer 37 is further formed on the polysilicon layer 36 as shown in FIG. 7G with a thickness of about 1000 Å to reduce the resistance of the bit line.

In the step of FIG. 7H, the polysilicon layer 36 and the tungsten silicide layer 37 are patterned into a number of parallel strips 38a, 38b, 38c and 38d, wherein the strips 38a and 38b are used for the word line of the DRAM device. The rest of the strips, the strips 38c and 38d are used as the gate of transistors that forms a peripheral circuit of the DRAM device.

In a step of FIG. 7I, the entire structure of FIG. 7H is covered by a photoresist 39 except for an exposed region between the field oxide region 30c and the field oxide region 30d. It should be noted that the exposed region includes the patterned conductor structure 38c.

Further, using the photoresist 39 as the mask, an ion implantation of phosphorus is conducted. Thereby an n-type diffusion region 30g and an n-type diffusion region 30h are formed in the substrate 30 at both sides of the structure 38c and a MOS transistor T1 is formed. This transistor may be used for the peripheral circuit of the DRAM device.

In a step of FIG. 7J, the photoresist 39 is removed and another photoresist 40 is provided such that only the region that is used for the transfer transistor is exposed. Further, the ion implantation process of P+ is employed again and there is formed an n-type source region 30i and an n-type drain region 30j are formed in the substrate 30. Thereby, a transfer transistor TR is formed by the source region 30i, the drain region 30j and the conductor structure 38a.

In a step of FIG. 7K, a silicon oxide layer 41 is deposited on the structure with a thickness of about 3000 Å after removal of the photoresist 40. This silicon oxide layer 41 is etched back in a step of FIG. 7L and thereby a structure is obtained wherein the silicon oxide is remained at both side walls of the polysilicon/tungsten silicide conductor strips 38a- 38 c. Further, using the silicon oxide at the side walls as the mask, the ion implantation of arsenic is carried out and thereby the diffusion regions 30g-30j are modified to diffusion regions 30g'-30j'. During the ion implantation, the n-type well 30a is protected by a photoresist 42.

In a next step of FIG. 7M, the photoresist 42 is removed and another photoresist 43 is provided such that only the region corresponding to the well 30a is exposed. Further, using the photoresist and the conductor structure 38d including the silicon oxide at both sides of the structure 38d as the mask, an ion implantation of BF2 is done to form p-type diffusion regions 30a-1 and 30a-2 in the well 30a. Thereby, there is formed a transistor T2 that is used for the peripheral circuit of the DRAM device.

In a next step of FIG. 7N, the photoresist 43 is removed and a silicon oxide layer 44 is deposited uniformly on the structure obtained in the step of FIG. 7M by the chemical vapor deposition with the thickness of about 1200 Å. Further, a contact hole 44a is formed in the silicon oxide layer 44 in correspondence to the diffusion region 30j' such that the diffusion region 30j' that acts as the drain of the transfer transistor TR of the DRAM is exposed. Further, a polysilicon layer 45 is deposited on the silicon oxide layer 44 uniformly with the thickness of about 2000 Å by the chemical vapor deposition such that the polysilicon layer 45 makes a contact with the drain 30j' of the transistor TR at the contact hole 44a.

Next, the polysilicon layer 45 is patterned in a step of FIG. 7O such that only a part 45a thereof that makes a contact with the drain 30j' at the contact hole 44a and extends on the silicon oxide layer 44 over the polysilicon/tungsten silicide structures 38a and 38b is remained. Thereby, the thickness of the polysilicon layer 45a is decreased to about 1000 Å and the polysilicon layer 45a forms the storage electrode of the memory capacitor of the DRAM device. Further, in a step of FIG. 7P, a silicon nitride film 46 is deposited on the polysilicon electrode 45a with the thickness of about 75 Å as the dielectric film of the capacitor. Further, a polysilicon layer 47 is deposited on the silicon nitride film 46 as the opposing electrode of the memory cell capacitor with the thickness of about 1500 Å and thereby a memory cell capacitor 48 is formed. It should be noted that the memory cell capacitor 48 may be the stacked capacitor as disclosed for example in the Laid-open European patent application EP 0 295 709 A2.

Further, in a step of FIG. 7Q, the structure thus obtained is covered by a silicon oxide layer 49 deposited with the thickness of about 2500 Å by the chemical vapor deposition process and contact holes 49a-49d are provided in correspondence to the diffusion regions 30i', 30j', 30g', 30h', 30a-2 and 30a-1, respectively. In a step of FIG. 7R, a polysilicon layer 50 is deposited on the silicon oxide layer 49 with the thickness of about 1000 Å to make contact with the diffusion regions 30a-1, 30a-2, 30g', 30h', 30i' and 30j' at the foregoing contact holes, and a tungsten silicide layer is formed on the polysilicon layer 50 as a layer 51 with the thickness of about 2000 Å.

In a step of FIG. 7S, the polysilicon layer 50 and the tungsten silicide layer 51 are patterned into electrodes 51a, 51b, 51c and 51d, Further, the electrodes 51a-51d are embedded in a PSG layer 52 that is provided by the chemical vapor deposition process. After the deposition, the PSG layer 52 is heat treated at a temperature of about 700° C. to provide an excellent planarized surface.

In a step of FIG. 7T, the PSG layer 52 is provided with a contact hole 52a in correspondence to the memory cell capacitor 48 such that the electrode 51a is exposed at a part thereof that locates immediately above the memory cell capacitor 48, and in a step of FIG. 7U, an aluminum layer 53 is deposited on the PSG layer 52 by sputtering with the thickness of about 1 μm. Thereby, the aluminum layer 53 makes a contact with the tungsten silicide layer 51 that forms the electrode 51a.

In a step of FIG. 7V, the aluminum layer 53 is patterned into an electrode 53a that extends as the bit line of the DRAM device, and the aluminum electrode 53a is buried under another PSG layer 54 that is deposited on the layer 52 with the thickness of about 5000 Å. This layer 52, too, is heat-treated at about 700° C. to obtain the planarized top surface.

In a step of FIG. 7W, a contact hole 54a is provided through the layers 52 and 54 to expose the electrode 51b. Similarly, another contact holes 54b and 54c are provided through the layers 52 and 54 to expose the electrodes 51c and 51d, respectively. Further, an aluminum layer is deposited on the layer 54 by sputtering with a thickness of about 1 μm, and is subsequently patterned to provide electrodes 55a and 55b that extends the bit lines 38a and 38b or electrodes 55c, 55d and 55c respectively connected to the electrodes 51b, 51c and 51d.

Further, in a step of FIG. 7X, the entire structure is covered by a PSG layer 56 that is deposited by the chemical vapor deposition process with the thickness of about 5000 Å, and the PSG layer 56 is further covered by a protective silicon nitride film 57 that is deposited by the chemical vapor deposition with the thickness of about 3000 Å.

In the fabrication processes described heretofore, it should be noted that a number of heat treatments are employed after the contact hole 52a is formed. For example, the deposition of the PSG layer 54 or 56 is accompanied by the reflowing process that is usually carried out at about 700° C. In each of such heat treatment, the silicon oxide layer 49 under the electrode 51a experiences heating. As the layer 49 has a tendency to absorb water, such a heating causes a chance that the absorbed water is released. When this occurs, the layer 49 may be deformed or cracked, and there is a substantial risk that the contact hole 52a and the electric contact established across the contact hole 52a may be damaged. Further, there is a possibility that the layer 49 may cause a ductile deformation upon heating. This problem becomes particularly serious when a low melting point glass is used for the layer 49. In the present invention, such a risk is positively prevented by setting the location of the contact hole 52a immediately above the memory cell capacitor 48 such that a mechanically rigid support is provided to the contact hole and to the electric connection by the memory cell capacitor 48. Thereby, a reliable DRAM device can be obtained.

Further, the present invention is not limited to those embodiments described heretofore, but various variations and modifications may be made without departing from the scope of the invention.

What is claimed is:

1. A dynamic random access memory comprising:
   a semiconductor substrate having an upper major surface;
   a transfer transistor provided on the semiconductor substrate, said transistor comprising first and second diffusion regions that are formed in the semiconductor substrate and exposed at the upper major surface of the substrate;
   a memory cell capacitor provided on the semiconductor substrate, said memory cell capacitor comprising a first electrode in contact with the first diffusion region at the upper major surface of the semiconductor substrate and located above the upper major surface with respect to the semiconductor substrate, a second electrode opposing with the first electrode and a dielectric film interposed between the first and second electrodes;
   a first conductor pattern provided on the semiconductor substrate to extend in a first direction as a word line of the dynamic random access memory;
   a first insulator layer provided on the upper major surface of the semiconductor substrate so as to bury the memory cell capacitor and the first conductor pattern, said first insulator layer having an upper major surface that is located above the memory cell capacitor and the first conductor pattern;
   a first contact hole provided on the first insulator layer so as to expose the second diffusion region;
   a second conductor pattern having an upper major surface and a lower major surface, said second conductor pattern being provided on the upper major surface of the first insulator layer and extending in a second, different direction, said second conductor pattern extending along the upper major surface of the first insulator layer, passing above the memory cell capacitor, said second conductor pattern being provided such that the lower major surface thereof makes a contact with the second diffusion region at the first contact hole;
   a second insulator layer having an upper major surface and a second major surface, said second insulator layer being provided on the second conductor pattern;
   a second contact hole provided on the second insulator layer at a part thereof that locates above, and in correspondence to the memory cell capacitor so as to expose the upper major surface of the second conductor pattern; and
   a third conductor pattern having a lower major surface, said third conductor pattern being provided on the second insulator layer so as to extend in the second direction substantially coincident with the second conductor pattern as a bit line of the dynamic random access memory, said third conductor pattern being provided such that the lower major surface thereof makes a contact with the upper major surface of the second conductor pattern at the second contact hole.

2. A dynamic random access memory as claimed in claim 1 in which said third conductor pattern comprises aluminum.

3. A dynamic random access memory as claimed in claim 1 in which said memory cell capacitor has a stacked capacitor structure wherein the first and second electrodes are stacked for a number of layers with a dielectric film interposed between each pair of the first and second electrodes.

4. A random access memory as claimed in claim 3 in which said lower major surface of the second conductor pattern faces, in a region thereof that corresponds to the second contact hole, the second electrode of the memory cell capacitor across the first insulator layer.

5. A random access memory as claimed in claim 1 in which said second conductor pattern comprises a material that is deposited by a chemical vapor deposition process.

6. A random access memory as claimed in claim 1 in which said second insulator layer comprises a material that forms a planarized surface upon heating.

* * * * *